US012000043B2

(12) United States Patent
Soininen et al.

(10) Patent No.: US 12,000,043 B2
(45) Date of Patent: Jun. 4, 2024

(54) PRECURSOR SOURCE ARRANGEMENT AND ATOMIC LAYER DEPOSITION APPARATUS

(71) Applicant: BENEQ OY, Espoo (FI)

(72) Inventors: Pekka Soininen, Espoo (FI); Hulda Aminoff, Espoo (FI); Pekka J. Soininen, Espoo (FI); Ville Miikkulainen, Espoo (FI)

(73) Assignee: BENEQ OY, Espoo (FI)

( * ) Notice: Subject to any disclaimer, the term of this patent is extended or adjusted under 35 U.S.C. 154(b) by 185 days.

(21) Appl. No.: 17/622,316

(22) PCT Filed: Jun. 26, 2020

(86) PCT No.: PCT/FI2020/050464
§ 371 (c)(1),
(2) Date: Dec. 23, 2021

(87) PCT Pub. No.: WO2020/260768
PCT Pub. Date: Dec. 30, 2020

(65) Prior Publication Data
US 2022/0243328 A1  Aug. 4, 2022

(30) Foreign Application Priority Data

Jun. 28, 2019  (FI) ...................... 20195589

(51) Int. Cl.
*C23C 16/455* (2006.01)
*C23C 16/448* (2006.01)

(52) U.S. Cl.
CPC .... *C23C 16/45544* (2013.01); *C23C 16/4485* (2013.01); *C23C 16/45527* (2013.01); *C23C 16/45561* (2013.01)

(58) Field of Classification Search
CPC .......... C23C 16/45544; C23C 16/4485; C23C 16/45561
See application file for complete search history.

(56) References Cited

U.S. PATENT DOCUMENTS

| 2002/0076492 A1 | 6/2002 | Loan et al. |
| 2003/0101938 A1 | 6/2003 | Ronsse et al. |

(Continued)

FOREIGN PATENT DOCUMENTS

WO   2013064737 A2   5/2013

OTHER PUBLICATIONS

International Search Report issued by the Finnish Patent and Registration Office acting as the International Searching Authority in relation to International Application No. PCT/FI2020/050464 dated Dec. 9, 2020 (7 pages).

(Continued)

*Primary Examiner* — Joseph A Miller, Jr.
(74) *Attorney, Agent, or Firm* — Robert P. Michal; Carter, DeLuca & Farrell LLP

(57) ABSTRACT

A precursor source arrangement for an atomic layer deposition reactor and to an atomic layer deposition apparatus wherein the precursor source arrangement includes a valve chamber having one or more supply valves, and a precursor source chamber having a precursor container space inside the precursor source chamber. The precursor source chamber includes a precursor source heat transfer element arranged to heat the precursor container inside the precursor container space. The valve chamber includes a valve chamber heat transfer element arranged to heat the one or more valves inside the valve chamber, and the valve chamber heat transfer element is arranged in heat transfer contact with the precursor source heat transfer element.

23 Claims, 4 Drawing Sheets

(56) References Cited

U.S. PATENT DOCUMENTS

| | | |
|---|---|---|
| 2004/0226513 A1* | 11/2004 | Inagawa ........... H01L 21/67109 |
| | | 118/724 |
| 2005/0221000 A1 | 10/2005 | Ikeda et al. |
| 2006/0222768 A1 | 10/2006 | Faguet |
| 2008/0063798 A1 | 3/2008 | Kher et al. |
| 2013/0312663 A1 | 11/2013 | Khosla et al. |
| 2016/0032453 A1 | 2/2016 | Qian et al. |
| 2018/0094351 A1 | 4/2018 | Verghese et al. |
| 2018/0163307 A1 | 6/2018 | Carlson |
| 2019/0184363 A1 | 6/2019 | Bosund et al. |

OTHER PUBLICATIONS

Written Opinion of the International Searching Authority issued by the Finnish Patent and Registration Office acting as the International Searching Authority in relation to International Application No. PCT/FI2020/050464 dated Dec. 9, 2020 (11 pages).

Office Action issued by the Finnish Patent and Registration Office in relation to Finnish U.S. Appl. No. 20/195,589 dated Sep. 24, 2021 (5 pages).

Finnish Search Report issued by the Finnish Patent and Registration Office in relation to Finnish Application No. 20195589 dated Jan. 28, 2020 (2 pages).

* cited by examiner

PRECURSOR SOURCE ARRANGEMENT AND ATOMIC LAYER DEPOSITION APPARATUS

CROSS-REFERENCE TO RELATED APPLICATIONS

This application is a national phase entry under 35 U.S.C. 371 of PCT International Application No. PCT/FI2020/050464 filed Jun. 26, 2020, which claims priority to Finnish Patent Application No. 20195589, filed Jun. 28, 2019, the disclosure of each of these applications is expressly incorporated herein by reference in their entirety.

FIELD OF THE INVENTION

The present invention relates to a precursor source arrangement. The present invention further relates to an atomic layer deposition apparatus.

BACKGROUND OF THE INVENTION

Atomic layer deposition method utilizes conventionally precursor materials having low vapour pressure. Usually these kinds of materials are solid precursor materials. However, also some liquid precursors may be considered as low vapour pressure materials. During atomic layer deposition method, the precursors are supplied to a reaction chamber of an atomic layer deposition apparatus in gas phase. Thus, the solid or liquid precursor materials are vaporized and dosed in gaseous form into the reaction chamber for subjecting a surface of a substrate to the precursor material. In order to supply these low vapour pressure precursors to the reaction chamber such that dose is large enough and the operating speed or dosing speed is good enough, the precursor materials need to be heated. Thus, these precursor sources or source arrangements are usually called hot sources.

One of the disadvantages of the prior art precursor source arrangements and atomic layer deposition apparatuses is that maintaining an increasing temperature gradient along the supply path of the precursor material is compromised such that the temperature of the precursor material may locally decrease during supplying to the reaction chamber. When the temperature of the precursor material decreases, the gaseous precursor tends to condensate into liquid. Liquid condensate deteriorates the atomic layer deposition process and apparatus. In the prior art, the increasing temperature gradient is provided with separate heating sheets which are manually installed on the precursor containers and supply lines and valves. Further, precursor sources need to be ventilated which further causes difficulties in maintaining the increasing temperature gradient.

BRIEF DESCRIPTION OF THE INVENTION

An object of the present invention is to provide a precursor source and an atomic layer deposition apparatus so as to overcome or at least alleviate the prior art disadvantages.

The objects of the invention are achieved by a precursor source. The objects of the invention are further achieved with an atomic layer deposition apparatus.

The preferred embodiments of the invention are disclosed in the dependent claims.

The invention is based on the idea of providing a precursor source arrangement for an atomic layer deposition reactor for receiving a precursor container. The precursor source arrangement comprises a valve chamber comprising one or more supply valves, a precursor source chamber having a precursor container space inside the precursor source chamber for receiving the precursor container. The precursor source chamber comprises a precursor source heat transfer element arranged to heat the precursor container inside the precursor container space and the valve chamber comprises a valve chamber heat transfer element arranged to heat the one or more valves inside the valve chamber. The valve chamber heat transfer element is arranged in heat transfer contact with the precursor source heat transfer element and arranged to transfer thermal energy from the valve chamber towards the precursor source chamber.

Accordingly, the precursor material is supplied from the precursor source chamber and from the precursor container to the valve chamber in which the supply valves are provided. From the valve chamber the precursor is further supplied into the vacuum chamber or the reaction chamber. The supply of the precursor is controlled by opening and closing the supply valve. In order to provide increasing temperature gradient along the supply path of the precursor, the valve chamber heat transfer element is provided to a higher temperature than the precursor source heat transfer element. As the valve chamber heat transfer element and the precursor source heat transfer element are provided in heat transfer contact with each other, the higher temperature of the valve chamber may be provided towards the precursor source chamber and thus increasing temperature gradient is achieved between the precursor source chamber and the valve chamber. Further, as the precursor containers and the supply valves are arranged in chambers, the surroundings of the precursor containers and the supply valves may be ventilated without or with minimally affecting the temperature precursor material.

In some embodiment, the precursor source chamber comprises a precursor source heater arranged to heat the precursor source heat transfer element.

In some embodiments, the valve chamber comprises a valve chamber heater arranged to heat the valve chamber heat transfer element.

In one embodiment, the precursor source chamber comprises a precursor source heater arranged to heat the precursor source heat transfer element and the valve chamber comprises a valve chamber heater arranged to heat the valve chamber heat transfer element.

Accordingly, the precursor source heat transfer element and the valve chamber heat transfer element may be heated separately to different temperatures.

In one embodiment, the precursor source chamber is a gas tight chamber.

In another embodiment, the precursor source chamber and the valve chamber are separate gas tight chambers.

Gas tight chamber prevent ventilation gas from substantially entering the chambers and affecting the temperature of the precursor container, the supply valves and further the precursor material.

In the context of this application, in relation to precursor supply chamber gas tight and or the valve chamber means that there is substantially no gas flow between the chamber space inside of the precursor supply chamber and/or the valve chamber and the outside of the precursor supply chamber and/or the valve chamber, meaning the inner precursor source casing space. Accordingly, gas tight means that leakage flow is less than 5 standard litre per minute (slm) into the chamber space of the precursor supply chamber and/or the valve chamber from outside. Preferably, the gas tight means that the above mentioned leakage flow is between 0 to 5 slm, or less than 3 slm, or more preferably less than 1 slm.

In one embodiment, the valve chamber heat transfer element is arranged to extend from the valve chamber to the precursor source.

In another embodiment, the precursor source heat transfer element is arranged to extend from the precursor source chamber and to the valve chamber.

The valve chamber heat transfer element and the precursor source heat transfer element are connected to each other and/or against each other for transferring thermal energy and heat from the valve chamber to the precursor source chamber.

In one embodiment, the valve chamber heat transfer element and the precursor source heat transfer element are arranged in contact with each other.

The contact between the valve chamber heat transfer element and the precursor source heat transfer element provides efficient heat transfer.

In another embodiment, the valve chamber heat transfer element and the precursor source heat transfer element are arranged in contact with each other in the precursor source chamber.

In this embodiment, the valve chamber heat transfer element extends inside the precursor source chamber. This is advantageous for providing thermal energy into the precursor source chamber which is at lower temperature than the valve chamber.

In an alternative embodiment, the valve chamber heat transfer element and the precursor source heat transfer element are arranged in contact with each other in the valve chamber.

In this embodiment, the higher temperature is provided in the valve chamber and the precursor chamber heat transfer element conducts thermal energy from the valve chamber to the precursor source chamber.

In one embodiment, the precursor source heat transfer element is provided on inner surface of the precursor source chamber.

In another embodiment, the precursor source heat transfer element is provided as an inner lining on inner surface of the precursor source chamber.

Accordingly, the precursor source heat transfer element is arranged to heat precursor container in the precursor source chamber. Thus, the precursor source heat transfer element is provided in contact or in the close vicinity of the precursor container inside the precursor container space.

In one embodiment, the precursor source heat transfer element is arranged to extend in height direction of the precursor source chamber or in vertical direction in the precursor source chamber.

In another embodiment, the precursor source heat transfer element is arranged to extend in the precursor source chamber in direction between a bottom and upper end of the precursor container space.

In a yet another embodiment, the precursor source heat transfer element is arranged to extend in the precursor source chamber from a bottom of the precursor container space to the upper end of the precursor source space.

Accordingly, the precursor container may be arranged in vertical orientation in the precursor source chamber. Further, the vertical orientation provides increasing temperature gradient towards the upper end of the precursor source chamber and the precursor container space. Thus, on outlet opening the precursor container may be provided to the upper end of the precursor source chamber and the precursor container space where the temperature is highest inside the precursor source chamber.

In one embodiment, the valve chamber heat transfer element is provided as a heat transfer plate in the valve chamber.

In another embodiment, the valve chamber heat transfer element is provided on bottom of the valve chamber inside the valve chamber.

In a further embodiment, the valve chamber heat transfer element is provided as a bottom plate inside the valve chamber.

Thus, the valve chamber is heated from the bottom and the generated heat moves upwards due to natural convection such that the upper part of the valve chamber may be provided in higher temperature than the lower part or bottom.

In one embodiment, the valve chamber heat transfer element is arranged to extend in horizontal direction or in a direction transversely to vertical direction.

In another embodiment, the valve chamber heat transfer element is arranged to extend perpendicularly or transversely to the precursor source heat transfer element.

Accordingly, the valve chamber heat transfer element may be provided to extend from the valve chamber to the precursor source chamber when the valve chamber and the precursor source chamber are arranged adjacent to each other in horizontal direction.

In one embodiment, the valve chamber heat transfer element connected to upper end of the precursor source heat transfer element.

In another embodiment, the precursor source heat transfer element is arranged to extend in vertical direction and the valve chamber heat transfer element is arranged to extend in horizontal direction, and that the valve chamber heat transfer element connected to upper end of the precursor source heat transfer element.

Therefore, the thermal energy from the valve chamber is transferred to the upper end of the precursor source heat transfer element for providing increasing temperature gradient inside the precursor source chamber towards the upper end of the precursor source chamber or the precursor container space.

In one embodiment, upper end of the precursor source heat transfer element is connected to the valve chamber heat transfer element.

In another embodiment, the precursor source heat transfer element is arranged to extend in vertical direction and the valve chamber heat transfer element is arranged to extend in horizontal direction, and that upper end of the precursor source heat transfer element is connected to the valve chamber heat transfer element.

Accordingly, the upper end of the precursor source heat transfer element may also extend in horizontal direction or direction transverse to the vertical direction towards the valve chamber heat transfer element for providing the heat transfer connection.

In one embodiment, the precursor source arrangement comprises a first precursor supply conduit extending from the precursor source chamber to the valve chamber. The precursor source arrangement comprises a support member arranged in heat transfer connection with the valve chamber heat transfer element. The first precursor supply conduit is supported to the support member for transferring thermal energy from the valve chamber heat transfer element to the first precursor supply conduit.

In another embodiment, the precursor source arrangement comprises a first support member arranged in heat transfer connection with the valve chamber heat transfer element inside the precursor source chamber. The first precursor supply conduit is supported to the first support member for transferring thermal energy from the valve chamber heat transfer element to the first precursor supply conduit.

Thus, the first precursor supply conduit is heated with the valve chamber heat transfer element such that increasing temperature gradient may be achieved in the first precursor supply conduit.

In one embodiment, the precursor source chamber and the valve chamber are arranged against each other, a lead-through being provided between the against each other arranged precursor source chamber and valve chamber, and the precursor source arrangement comprises the first precursor supply conduit extending from the precursor source chamber to the valve chamber via the lead-through. The lead-through comprises a second support member arranged in heat transfer connection with the valve chamber heat transfer element. The first precursor supply conduit being supported to the second support member for transferring thermal energy from the valve chamber heat transfer element to the first precursor supply conduit.

In another embodiment, the precursor source arrangement comprises the first support member arranged in heat transfer connection with the valve chamber heat transfer element inside the precursor source chamber and the lead-through comprises a second support member arranged in heat transfer connection with the valve chamber heat transfer element. The first precursor supply conduit being supported to the first and second support members for transferring thermal energy from the valve chamber heat transfer element to the first precursor supply conduit.

The lead-through subjects the precursor path to temperature variations and possible decrease of temperature. Thus, the valve chamber heat transfer element is utilized for heating the first precursor conduit between the precursor source chamber and the valve chamber.

In one embodiment, the precursor source chamber comprises an upper precursor source space provided inside the precursor source chamber and above the precursor container space. The precursor source arrangement comprises the first precursor supply conduit extending from the precursor source chamber to the valve chamber, the first precursor supply conduit being arranged to extend via the upper precursor source space to the valve chamber.

In another embodiment, the precursor source arrangement comprises the first precursor supply conduit extending from the precursor source chamber to the valve chamber and the first support member arranged in heat transfer connection with the valve chamber heat transfer element inside the upper precursor source space. The first precursor supply conduit being arranged to extend via the upper precursor source space to the valve chamber and being supported to the first support member for transferring thermal energy from the valve chamber heat transfer element to the first precursor supply conduit.

The upper precursor source space collects thermal energy or heat due to natural convection and this is utilized form providing increasing temperature gradient for the first precursor supply conduit.

In one embodiment, the valve chamber heat transfer element is arranged to extend from the valve chamber to the precursor source chamber and the precursor source arrangement comprises the first precursor supply conduit extending from the precursor source chamber to the valve chamber above the valve chamber heat transfer element.

Accordingly, the valve chamber heat transfer element is utilized between the precursor source chamber and the valve chamber for heating the first precursor supply conduit along the distance between the precursor source chamber and the valve chamber.

In one embodiment, the one or more supply valves are attached to the valve chamber heat transfer element inside the valve chamber.

Thus, the supply valves are heated for preventing temperature drop of the precursor.

In one embodiment, the valve chamber comprises a precursor supply connection arranged to a valve chamber wall, and a second precursor supply conduit extending from the supply valve to the precursor supply connection. The precursor supply connection being arranged in vertical direction above the supply valve in the valve chamber.

Thus, the precursor is supplied out of the valve chamber via the second precursor supply conduit and the precursor supply connection. The precursor supply connection is arranged in vertical direction above the supply valves such that increasing temperature gradient is achieved due to natural convection.

In one embodiment, the precursor source arrangement comprises a precursor source casing surrounding the precursor source chamber and the valve chamber. The precursor source chamber and the valve chamber is arranged inside the precursor source casing. The precursor source casing comprises a ventilation inlet and a ventilation outlet for ventilating the inside of the precursor source casing.

Accordingly, the surroundings of the precursor source chamber and the valve chamber is ventilated for transporting excess heat away such that the temperature of the precursor may be controlled in detail.

In one embodiment, the ventilation outlet is provided in vertical direction above the ventilation inlet inside the precursor source casing.

In another embodiment, the ventilation inlet is arranged in vertical direction below the precursor source chamber, and the ventilation outlet is provided in vertical direction above the ventilation inlet inside the precursor source casing.

In yet another embodiment, the ventilation outlet is provided above in vertical direction above valve chamber and in vertical direction above the ventilation inlet inside the precursor source casing.

In a further embodiment, the ventilation inlet is arranged in vertical direction below the precursor source chamber, and the ventilation outlet is provided above in vertical direction above the valve chamber, and the ventilation outlet is provided in vertical direction above the ventilation inlet inside the precursor source casing.

Accordingly, the ventilation gas is arranged to flow in direction increasing temperature gradient such that excess heat from higher temperature areas is not transported to areas of lower temperature.

In one embodiment, the precursor source arrangement comprises a first precursor source chamber connected to the valve chamber and a second precursor source chamber connected to the valve chamber. The first and second precursor source chamber is at a distance from each other such that a flow gap is provided between the first and second precursor source chamber for ventilation gas flow.

The first and second precursor source chamber are thus thermally separated and may be kept at different temperatures without the temperatures affecting each other.

The present invention further relates to an atomic layer deposition apparatus for processing a substrate according to principles of atomic layer deposition method. The apparatus comprises a vacuum chamber, a reaction chamber inside the vacuum chamber, a process heater arranged inside the vacuum chamber for heating the reaction chamber inside the vacuum chamber, a precursor source arrangement, a lead-through connection provided to and extending from the vacuum chamber between the vacuum chamber and the precursor source arrangement, and a second precursor supply conduit extending from the precursor source arrangement inside the vacuum chamber via the lead-through connection.

According to the present invention, the precursor source arrangement is a precursor source arrangement as disclosed above. Further, in the apparatus the precursor source arrangement comprises a precursor supply connection, the second precursor supply conduit is connected to the precursor supply connection, and the precursor supply connection is connected to the lead-through connection.

Accordingly, the thermal energy from the vacuum chamber is brought to the precursor source arrangement via the precursor supply connection for providing the increasing temperature gradient along the precursor supply path.

An advantage of the invention is that an increasing temperature gradient along the supply path of the precursor is generated such that condensation problems may be avoided or minimized. Further, as the precursor containers and the supply valves are arranged in chambers, the surroundings of the precursor containers and the supply valves may be ventilated without or with minimally affecting the temperature precursor material.

BRIEF DESCRIPTION OF THE DRAWINGS

The invention is described in detail by means of specific embodiments with reference to the enclosed drawings, in which.

DETAILED DESCRIPTION OF THE INVENTION

Figure 1:
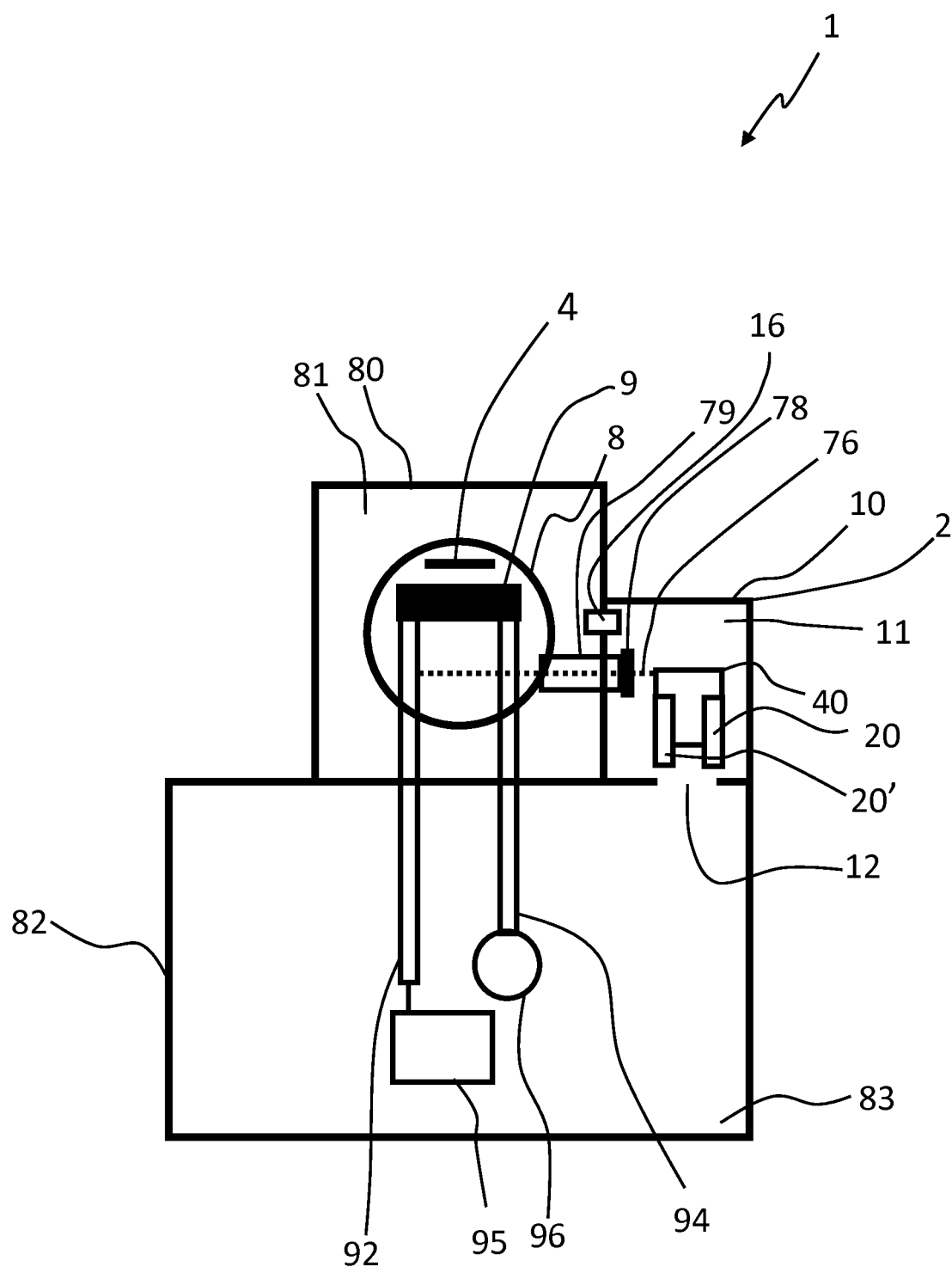
FIG. 1 shows a schematic view of one embodiment of an atomic layer deposition apparatus according to the present invention.

FIG. 1 shows a schematic view of an atomic layer deposition apparatus 1 for processing a substrate according to principles of atomic layer deposition method. The apparatus 1 comprises a vacuum chamber 8 and a reaction chamber 9 inside the vacuum chamber 8. Substrates are processed inside the reaction chamber. In some embodiment, the vacuum chamber 8 and the reaction chamber 9 may form one single chamber.

The vacuum chamber 8 and the reaction chamber 9 are arranged inside a reactor compartment space 81 of a reactor compartment or reactor casing 80 surrounding the vacuum chamber 8.

The apparatus further comprises a process heater 4 arranged inside the vacuum chamber 8 for heating the reaction chamber 9 inside the vacuum chamber 8. The process heater 4 is provided outside of the reaction chamber 9 for radiation heating the reaction chamber 9 and the substrate during processing. The process heater 4 heats the reaction chamber 9 to the process temperature which may be for example 150 to 400° C.

The apparatus comprises an inlet channel 92 extending from outside the vacuum chamber 8 into the vacuum chamber 8 and to the reaction chamber 9 for supplying precursors into the reaction chamber 9. The inlet channel 92 is connected to the supply unit 95 comprising process valves and gas connections for carrier gas, purge gas or other gaseous materials supplied to the reaction chamber 9. The apparatus further comprises an outlet channel 94 extending from the reaction chamber 9 inside the vacuum chamber 8 to outside of the vacuum chamber 8 for discharging precursors and other gases from the reaction chamber 9. A filter unit 96 is provided to the outlet channel 94 for filtering the gases discharged from the reaction chamber 9.

The inlet channel 92 and the outlet channel 94 extend to the vacuum chamber 8 and the reaction chamber 9 in vertical direction and from below the vacuum chamber 8 and the reaction chamber 9.

The supply unit 95 and the filter unit 96 are arranged to an instrumentation compartment 82 and inside an instrumentation space 83 of the instrumentation compartment 82. The instrumentation compartment 82 is provided in vertical direction below the reactor compartment 80. The inlet channel 92 and the outlet channel 94 extend from the instrumentation compartment 82 to the reactor compartment 80.

The apparatus also comprises a precursor source arrangement 2 for receiving one or more precursor containers and for supplying precursor materials to the reaction chamber 9.

The apparatus comprises a lead-through connection 79 provided to and extending from the vacuum chamber 8 between the vacuum chamber 8 and the precursor source arrangement 2. Thus, the lead-through connection 79 extends between the vacuum chamber 8 and the precursor source arrangement. A second precursor supply conduit 76 is arranged to extend from the precursor source arrangement 2 inside the vacuum chamber 8 via the lead-through connection 79, as shown in FIG. 1.

The lead through connection 79 is provided with a precursor supply connection 78 in the precursor source arrangement. The second precursor supply conduit 76 is connected to the precursor supply connection 78 in the precursor source arrangement. The precursor supply connection 78 may be flange or a plate or the like to which the second precursor supply conduit 76 may be connected or attached.

The second precursor supply conduit 76 is further connected to the inlet channel 92 inside the vacuum chamber 8 for supplying precursor material into the reaction chamber 9.

The precursor source arrangement 2 comprises one or more precursor source chamber 20, 20' for receiving and holding precursor containers. The precursor source arrangement 2 also comprises a valve chamber 40 comprising one or more supply valves. The second precursor supply conduit 76 extends from the valve chamber 40 via the lead-through connection 79 inside the vacuum chamber 8 and to the inlet channel 92. The second precursor supply conduit 76 is connected to the supply valve inside the valve chamber 40 and to the inlet channel 92. Thus, second precursor supply conduit 76 extends between the supply valve inside the valve chamber 40 and to the inlet channel 92 inside the vacuum chamber 8. The precursor container is arranged into the precursor source chamber 20, 20' and a first precursor supply conduit is provided between the precursor source chamber 20, 20' and the valve chamber 40. Therefore, the first precursor supply conduit is connected to the precursor container inside the precursor source chamber 20, 20' and to the supply valve inside the valve chamber 40.

Accordingly, the precursor is supplied from the precursor container and from the precursor source chamber with the first precursor supply conduit to the valve chamber 40 and to the supply valve and further from the supply valve and the valve chamber 40 to the inlet channel 92 with the second precursor supply conduit 76.

The precursor source arrangement 2 further comprises a precursor source casing 10 or compartment surrounding the precursor source chambers 20, 20' and the valve chamber 40. The precursor source chamber 20, 20' and the valve chamber 40 are arranged inside the precursor source casing 10 in a precursor source casing space 11. The precursor source casing 10 comprising a ventilation inlet 12 and a ventilation outlet 16 for ventilating the inside of the precursor source casing 10, the precursor source casing space 11.

The ventilation outlet 16 is connected to a ventilation discharge arrangement providing suction for generating ventilation gas flow between the ventilation inlet 12 and the ventilation outlet 16.

In the embodiment of FIG. 1, the ventilation inlet 12 is provided between the instrumentation compartment 82 and the precursor source compartment 10 such that ventilation gas may flow from the instrumentation compartment 82 to the precursor source compartment 10. However, the ventilation inlet 12 may also be provided to outer wall of the precursor source compartment 10 such that ventilation gas may flow into the precursor source compartment 10 from outside of the apparatus.

In the embodiment of FIG. 1, the ventilation outlet 16 is provided between the precursor source compartment 10 and the reactor compartment 80 such that ventilation gas may flow from the precursor source compartment 10 to the reactor compartment 80. However, the ventilation outlet 16 may also be provided to outer wall of the precursor source compartment 10 such that ventilation gas may flow out of the apparatus 1 via the ventilation outlet 16.

Accordingly, the ventilation gas is arranged to flow through the precursor source compartment 10 from the ventilation inlet 12 to the ventilation outlet 16.

Figure 2:
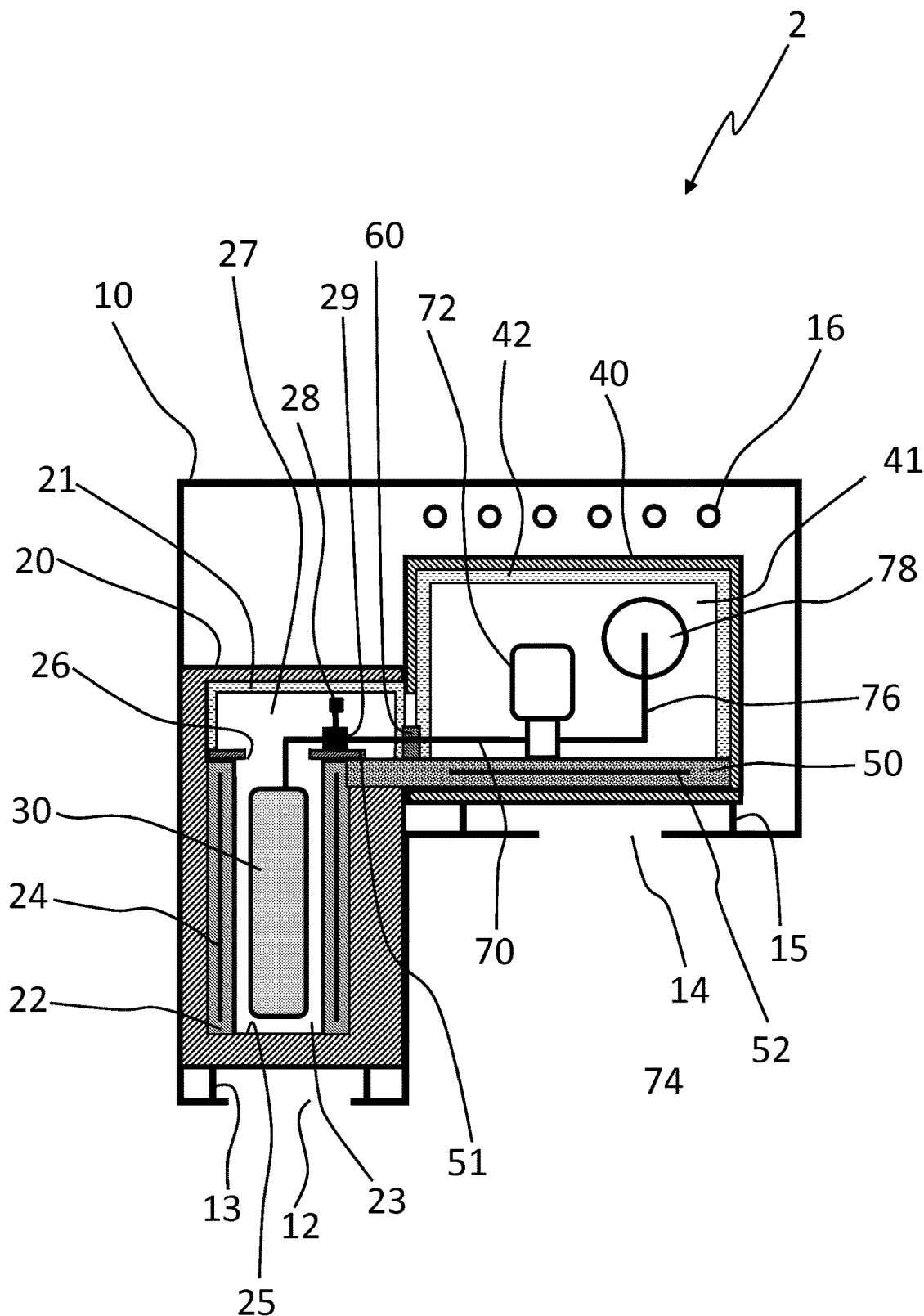
FIG. 2 shows a schematic side view of one embodiment of a precursor source arrangement according to the present invention.

FIG. 2 shows a schematic view of one embodiment of the precursor source 2 according to the present invention.

The precursor source arrangement 2 comprises the precursor source compartment or casing 10 having casing wall 10 and enclosing the precursor source chamber(s) 20 and the valve chamber 40 inside the precursor source casing 10.

The precursor source chamber 20 comprises precursor source chamber walls 20 defining and providing a precursor container space 23 inside the precursor source chamber 20 for receiving the precursor container 30. The precursor source chamber 20 further comprises an upper precursor source space 27 provided inside the precursor source chamber 20 and above the precursor container space. Thus, there is the precursor container space 23 into which the precursor container 30 installed and the upper precursor source space 27 above and in fluid connection with the precursor container space 23. The walls of the precursor container chamber 20 may be made of steel or the like material.

The precursor source chamber 20 is preferably provided as gas tight chamber.

The upper precursor source space 27 is provided with a first thermal insulation 21. The first thermal insulation 21 is provided on the inner surface of the walls of the upper precursor source space 27. The first thermal insulation 21 prevents thermal energy escaping from the precursor source chamber 20 via the upper precursor source space 27.

The valve chamber 40 comprises valve chamber walls 40 defining and providing a valve chamber space 41 inside the valve chamber 40 for receiving one or more supply valves 72. The supply valves 72 are operated for controlling the supply of precursor material from the precursor container 30 to the inlet channel 92 and further to the reaction chamber 9. The walls of the valve chamber 40 may be made of steel or the like material.

The valve chamber 40 is preferably provided as gas tight chamber.

The valve chamber 40 is provided with a second thermal insulation 42. The second thermal insulation 42 is provided on the inner surface of the walls of the valve chamber 40. The thermal insulation prevents thermal energy escaping from the valve chamber 40.

The precursor source chamber 20 comprises a precursor source heat transfer element 22 arranged to heat the precursor container 30 inside the precursor container space 23. The precursor source heat transfer element 22 is provided on inner surface of the precursor container space 23 or as inner lining on inner surface of the precursor container space 23, as shown in FIG. 2. The precursor source heat transfer element 22 is further arranged to extend in height direction of the precursor source chamber 20 or the precursor container space 23, or in vertical direction in the precursor source chamber 20 or the precursor container space 23.

The precursor source container space 23 comprises a bottom 25 and upper end 26. The precursor source heat transfer element 22 is arranged to extend in the precursor source chamber 20 in direction between the bottom 25 and the upper end 26 of the precursor container space 23, or from the bottom of the precursor container space 23 to the upper end 26 of the precursor source space 23.

Accordingly, the precursor source heat transfer element 22 is arranged to heat the precursor container 30 along precursor container 30, preferably along the whole length of the precursor container 30.

The precursor source heat transfer element 22 comprises a precursor source heater 24 arranged to heat the precursor source heat transfer element 22. The precursor source heater 24 may be an electrical heater or resistant heater. The precursor source heat transfer element 22 may be heat transfer member or plate made of aluminium or some other material having high thermal conductivity. The precursor source heater 24 may be connected, embedded or in heat transfer contact with the precursor source heat transfer element or member.

The valve chamber 40 comprises a valve chamber heat transfer element 50 arranged to heat the supply valves and the valve chamber space 41 inside the valve chamber 40. The valve chamber heat transfer element 40 is provided on bottom of the valve chamber 40 and the valve chamber space 41, as shown in FIG. 2. The valve chamber heat transfer element 50 is provided as a heat transfer plate in the valve chamber 40 and on bottom of the valve chamber 40 inside the valve chamber 40. Thus, the valve chamber heat transfer element 50 is provided as a bottom plate inside the valve chamber 40. The valve chamber heat transfer element 40 may be made of aluminium of some other material having high thermal conductivity. Further, the valve chamber heat transfer element 50 is arranged to extend substantially in horizontal direction or in a direction transversely to vertical direction.

The valve chamber heat transfer element 50 is arranged to extend perpendicularly or transversely to the precursor source heat transfer element 22, as shown in FIG. 2.

The valve chamber heat transfer element 50 comprises a valve chamber heater 52 arranged to heat the valve chamber heat transfer element 50. The valve chamber heater 52 may be an electrical heater or resistant heater. The valve chamber heater 52 may be connected, embedded or in heat transfer contact with the valve chamber heat transfer element or member 50.

The one or more supply valves 72 are attached to the valve chamber heat transfer element 50 inside the valve chamber 40 for heating the supply valves 72.

As shown in FIG. 2, the valve chamber heat transfer element 50 is arranged to extend from the valve chamber 40 into the precursor source chamber 20. The valve chamber heat transfer element 50 and the precursor source heat transfer element 22 are arranged in contact with each other in the precursor source chamber 20. Thus, the valve chamber heat transfer element 50 provides thermal energy to the precursor source heat transfer element 22.

Further, the valve chamber heat transfer element 50 connected to upper end of the precursor source heat transfer element 22. This is achieved, such that the precursor source heat transfer element 22 is arranged to extend in vertical direction and the valve chamber heat transfer element 50 is arranged to extend in horizontal direction, as shown in FIG. 2. Thus, thermal energy from the valve chamber 40 is brought to the upper end of the precursor container space 23 and the upper end of the precursor container 30.

The precursor source arrangement 2 comprises a first precursor supply conduit 70 extending from the precursor source chamber 20 to the valve chamber 40. The first precursor supply conduit 70 is connected to the precursor container 30 and comprises a container valve 28 for opening and closing the first precursor supply conduit 70. The first precursor conduit 70 is further connected to the supply valve 72 inside the valve chamber 40. Thus, the first precursor supply conduit 70 extends from the precursor container 30 in the precursor source chamber 20 to the supply valve 72 in the valve chamber 40.

The precursor source arrangement 2 further comprises a first support member 29 arranged in heat transfer connection with the valve chamber heat transfer element 50 inside the precursor source chamber 20. The first precursor supply conduit 70 being supported to the first support member 29 for transferring thermal energy from the valve chamber heat transfer element 50 to the first precursor supply conduit 70. Further, the container valve 28 is supported to the first support member 29 for transferring thermal energy from the valve chamber heat transfer element 50 to the container valve 28.

The first support member 29 is further connected to a heat transfer block 51 which is connected to the valve chamber heat transfer element 50 for transferring thermal energy from the valve chamber heat transfer element 50 to the first support member 29 and further to the container valve 28 and the first precursor supply conduit 70. The heat transfer block 51 may be heat transfer member or plate made of aluminium or some other material having high thermal conductivity.

The first precursor supply conduit 70 extends from the precursor source chamber 20 to the valve chamber 40 and the first support member 29 arranged in heat transfer connection with the valve chamber heat transfer element 50 inside the upper precursor source space. The first precursor supply conduit 70 is arranged to extend via the upper precursor source space 27 to the valve chamber 40 and is supported to the first support member 29 for transferring thermal energy from the valve chamber heat transfer element 50 to the first precursor supply conduit 70.

The precursor source chamber 20 and the valve chamber 40 are arranged against each other, and a lead-through 60 is provided between the against each other arranged precursor source chamber 20 and valve chamber 40. The first precursor supply conduit 70 extends from the precursor source chamber 20 to the valve chamber 40 via the lead-through, as shown in FIG. 2. The lead-through comprises a second support member 60 arranged in heat transfer connection with or connected to the valve chamber heat transfer element 50. The first precursor supply conduit 70 is supported to the second support member 60 between the precursor source chamber 20 and the valve chamber 40 for transferring thermal energy from the valve chamber heat transfer element 50 to the first precursor supply conduit 70. The second support member 60 may be heat transfer member or plate made of aluminium or some other material having high thermal conductivity.

As shown in FIG. 2, the valve chamber heat transfer element 50 is arranged to extend from the valve chamber 40 to the precursor source chamber 20 and the first precursor supply conduit 70 is arranged extend from the precursor source chamber 20 to the valve chamber 40 above or in close vicinity of the valve chamber heat transfer element 50.

The valve chamber 40 comprises the precursor supply connection 78 arranged to the valve chamber wall 40. The second precursor supply conduit 76 extends from the supply valve 72 to the precursor supply connection 78. The precursor supply connection being arranged in vertical direction above the supply valve 72 in the valve chamber 40. The precursor supply connection 78 may be a flange or the like plate.

The precursor source arrangement 2 comprises the precursor source casing 10 surrounding the precursor source chambers 20 and the valve chamber 40. The precursor source chamber 20 and the valve chamber 40 are arranged inside the precursor source casing 10. The precursor source casing 10 comprises one or more first ventilation inlets 12 arranged in vertical direction below the precursor source chambers 20, as shown in FIG. 2. The precursor source chambers 20 are supported to the precursor source casing 10 with first support legs 13 for providing a first ventilation gap between the precursor source chambers 20 and the precursor source casing 10. Thus, the ventilation gas may flow past and/or around the precursor source chambers 20.

The precursor source casing 10 comprises one or more second ventilation inlets 14 arranged in vertical direction below the valve chamber 40, as shown in FIG. 2. The valve chamber 40 is supported to the precursor source casing 10 with second support legs 15 for providing a second ventilation gap between the valve chamber 40 and the precursor source casing 10. Thus, the ventilation gas may flow past and/or around the valve chamber 40.

The precursor source casing 10 comprises the one or more ventilation outlets 16 provided in vertical direction above the first ventilation inlet 12 inside the precursor source casing 10 and/or above the second ventilation inlet 14 inside the precursor source casing 10.

Figure 3:
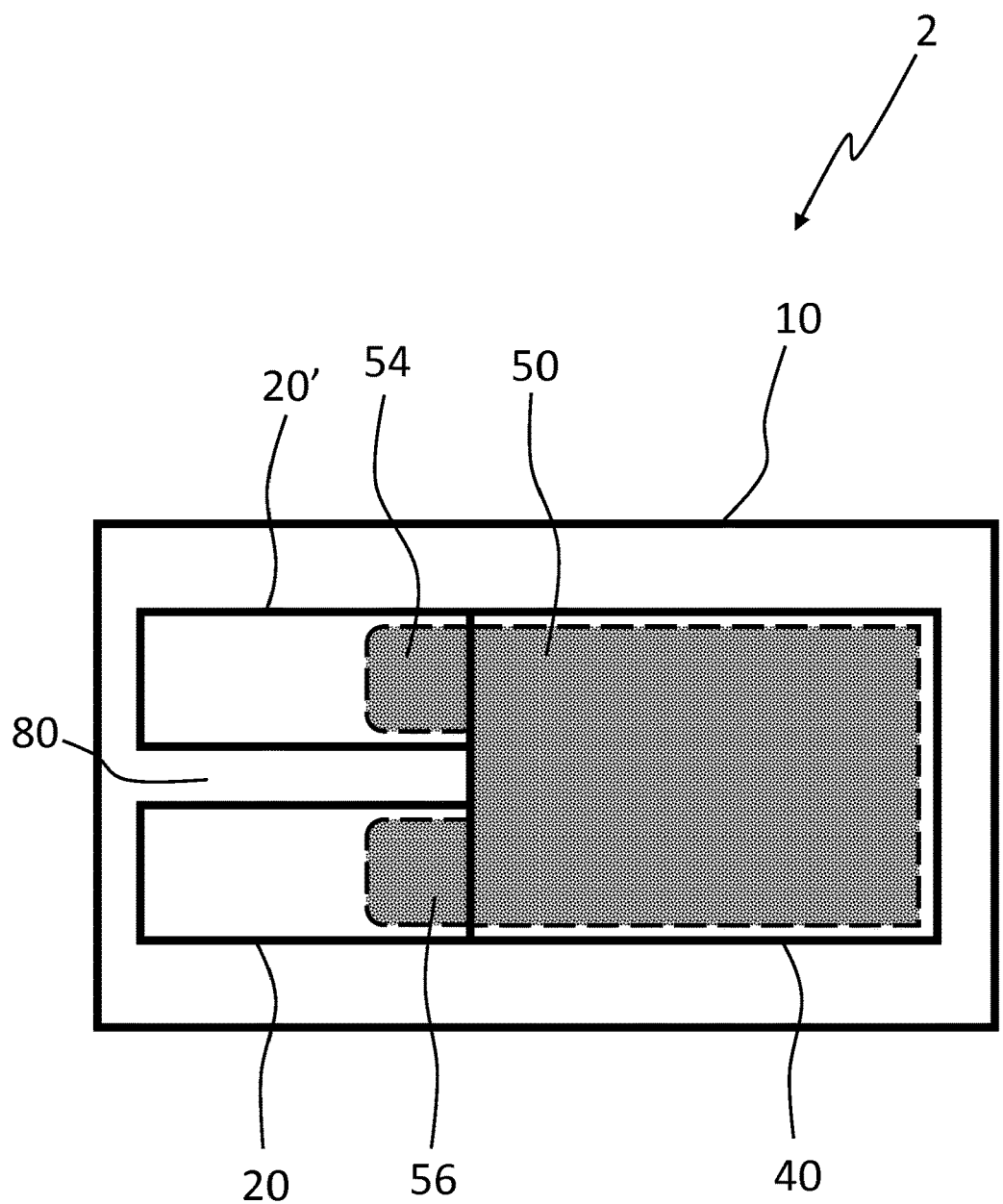
FIGS. 3 and 4 shows schematic top views of the precursor source arrangement of FIG. 2.

FIG. 3 shows a schematic top view of the precursor source arrangement of FIG. 2. The precursor source arrangement 2 comprises a first precursor source chamber 20 connected to the valve chamber 40 and a second precursor source chamber 20' connected to the valve chamber 40. The first and second precursor source chambers 20, 20' are arranged at a distance from each other such that a flow gap 80 is provided between the first and second precursor source chamber 20, 20' for ventilation gas flow.

The valve chamber heat transfer element or plate 50 comprises a first extension 56 extending from the valve chamber 40 to the first precursor source chamber 20 and a second extension 54 extending from the valve chamber 40 to the second precursor source chamber 20'. Thus, the same valve chamber heat transfer element or plate 50 is arranged to provide thermal energy to the first and second precursor source chambers 20, 20'.

Figure 4:
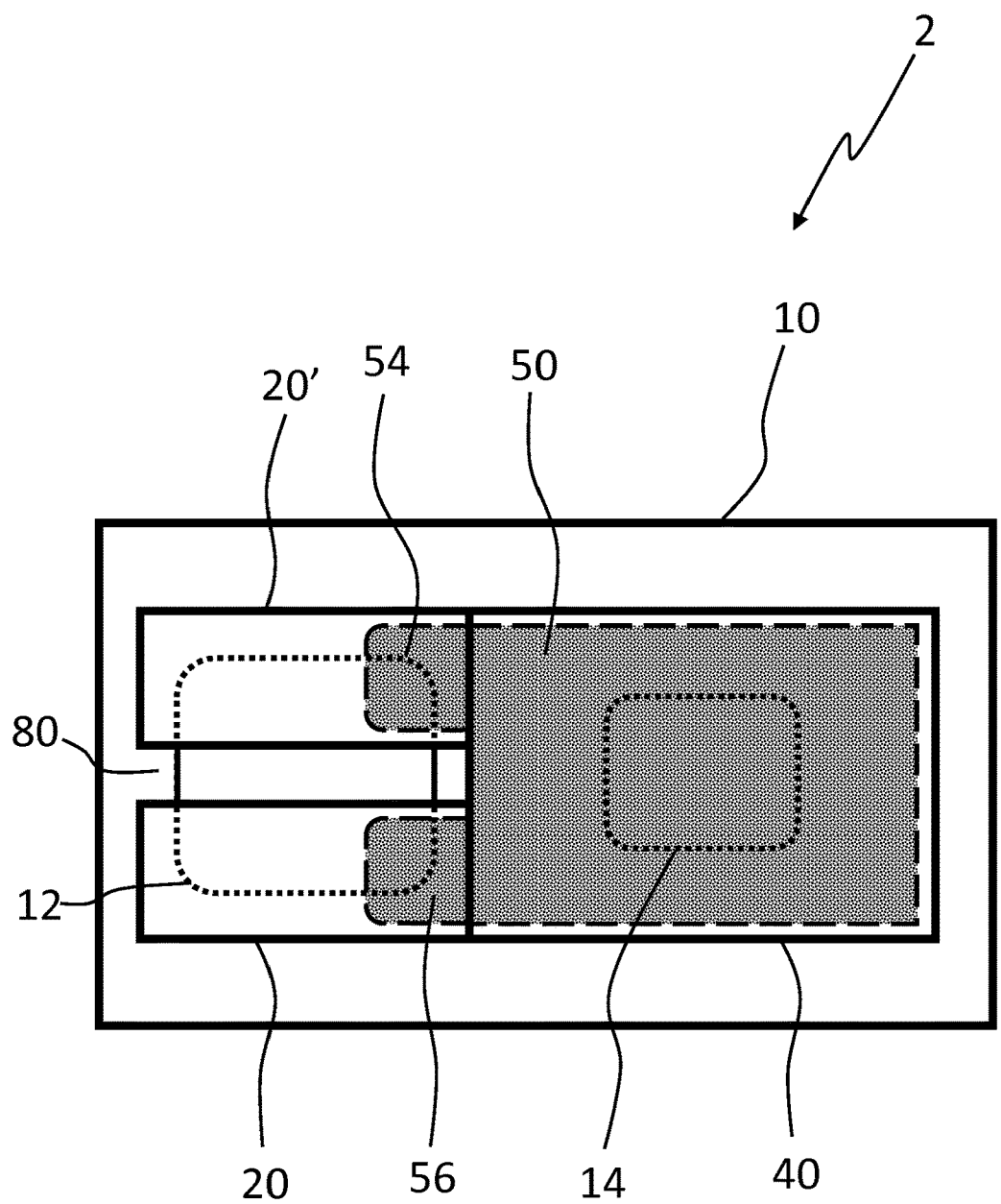

FIG. 4 shows schematically, the first ventilation inlets 12 arranged in vertical direction below the precursor source chambers 20, 20' and below the flow gap 80 between the first and second precursor source chambers 20, 20'. The second ventilation inlet 14 is arranged in vertical direction below the valve chamber 40, as shown in FIG. 4.

The invention has been described above with reference to the examples shown in the figures. However, the invention is in no way restricted to the above examples but may vary within the scope of the claims.

The invention claimed is:

1. A precursor source arrangement for an atomic layer deposition reactor for receiving a precursor container, wherein the precursor source arrangement comprises:
   a valve chamber including one or more valves;
   a precursor source chamber having a precursor container space inside the precursor source chamber for receiving the precursor container;
   a precursor source heat transfer element positioned at least partially within the precursor source chamber and arranged to heat the precursor container inside the precursor container space; and
   a valve chamber heat transfer element positioned at least partially within the valve chamber and arranged to heat the one or more valves inside the valve chamber, wherein
   the valve chamber heat transfer element and the precursor source heat transfer element are arranged in contact with each other such that the valve chamber heat transfer element is arranged in heat transfer contact with the precursor source heat transfer element and arranged to transfer thermal energy from the valve chamber towards the precursor source chamber.

2. The precursor source arrangement according to claim 1, wherein:
   the precursor source chamber includes a precursor source heater arranged to heat the precursor source heat transfer element and the valve chamber comprises a valve chamber heater arranged to heat the valve chamber heat transfer element; or
   the precursor source chamber includes a precursor source heater arranged to heat the precursor source heat transfer element; or
   the valve chamber comprises a valve chamber heater arranged to heat the valve chamber heat transfer element.

3. The precursor source arrangement according to claim 1, wherein:
   the precursor source chamber is a gas tight chamber; or
   the precursor source chamber and the valve chamber are separate gas tight chambers.

4. The precursor source arrangement according to claim 1, wherein:
   the valve chamber heat transfer element is arranged to extend from the valve chamber to the precursor source chamber; or
   the precursor source heat transfer element is arranged to extend from the precursor source chamber and to the valve chamber.

5. The precursor source arrangement according to claim 1, wherein:
   the valve chamber heat transfer element and the precursor source heat transfer element are arranged in the precursor source chamber; or
   the valve chamber heat transfer element and the precursor source heat transfer element are arranged in the valve chamber.

6. The precursor source arrangement according to claim 1, wherein:
   the precursor source heat transfer element is provided on an inner surface of the precursor source chamber; or
   the precursor source heat transfer element is provided as an inner lining on the inner surface of the precursor source chamber.

7. The precursor source arrangement according to claim 1, wherein:
   the precursor source heat transfer element is arranged to extend in a height direction of the precursor source chamber or in a vertical direction in the precursor source chamber; or
   the precursor source heat transfer element is arranged to extend in the precursor source chamber in a direction between a bottom and an upper end of the precursor container space; or
   the precursor source heat transfer element is arranged to extend in the precursor source chamber from a bottom of the precursor container space to the upper end of the precursor source space.

8. The precursor source arrangement according to claim 1, wherein:
   the valve chamber heat transfer element is provided as a heat transfer plate in the valve chamber; or
   the valve chamber heat transfer element is provided on a bottom of the valve chamber inside the valve chamber; or
   the valve chamber heat transfer element is provided as a bottom plate inside the valve chamber.

9. The precursor source arrangement according to claim 1, wherein:
   the valve chamber heat transfer element is arranged to extend in horizontal direction or in a direction transverse to a vertical direction; or
   the valve chamber heat transfer element is arranged to extend perpendicularly or transversely to the precursor source heat transfer element.

10. The precursor source arrangement according to claim 1, wherein:
    the valve chamber heat transfer element connected to an upper end of the precursor source heat transfer element; or
    the precursor source heat transfer element is arranged to extend in a vertical direction and the valve chamber heat transfer element is arranged to extend in a horizontal direction, and that the valve chamber heat transfer element is connected to upper end of the precursor source heat transfer element; or
    an upper end of the precursor source heat transfer element is connected to the valve chamber heat transfer element; or
    the precursor source heat transfer element is arranged to extend in the vertical direction and the valve chamber heat transfer element is arranged to extend in the horizontal direction, and that upper end of the precursor source heat transfer element is connected to the valve chamber heat transfer element.

11. The precursor source arrangement according to claim 1, wherein the precursor source arrangement comprises a first precursor supply conduit extending from the precursor source chamber to the valve chamber, and that:
- the precursor source arrangement includes a support member arranged in heat transfer connection with the valve chamber heat transfer element, the first precursor supply conduit being supported to the support member for transferring thermal energy from the valve chamber heat transfer element to the first precursor supply conduit; or
- the precursor source arrangement comprises a first support member arranged in heat transfer connection with the valve chamber heat transfer element inside the precursor source chamber, the first precursor supply conduit being supported to the first support member for transferring thermal energy from the valve chamber heat transfer element to the first precursor supply conduit.

12. The precursor source arrangement according to claim 1, wherein the precursor source chamber and the valve chamber are arranged against each other, a lead-through being provided between the against each other arranged precursor source chamber and valve chamber, and that the precursor source arrangement comprises the first precursor supply conduit extending from the precursor source chamber to the valve chamber via the lead-through, and that:
- the lead-through includes a second support member arranged in heat transfer connection with the valve chamber heat transfer element, the first precursor supply conduit being supported to the second support member for transferring thermal energy from the valve chamber heat transfer element to the first precursor supply conduit; or
- the precursor source arrangement comprises the first support member arranged in heat transfer connection with the valve chamber heat transfer element inside the precursor source chamber and the lead-through comprises a second support member arranged in heat transfer connection with the valve chamber heat transfer element, the first precursor supply conduit being supported to the first and second support members for transferring thermal energy from the valve chamber heat transfer element to the first precursor supply conduit.

13. The precursor source arrangement according to claim 1, wherein the precursor source chamber comprises an upper precursor source space provided inside the precursor source chamber and above the precursor container space, and that:
- the precursor source arrangement comprises a first precursor supply conduit extending from the precursor source chamber to the valve chamber, the first precursor supply conduit being arranged to extend via the upper precursor source space to the valve chamber; or
- the precursor source arrangement comprises the first precursor supply conduit extending from the precursor source chamber to the valve chamber and the first support member arranged in heat transfer connection with the valve chamber heat transfer element inside the upper precursor source space, the first precursor supply conduit being arranged to extend via the upper precursor source space to the valve chamber and being supported to the first support member for transferring thermal energy from the valve chamber heat transfer element to the first precursor supply conduit.

14. The precursor source arrangement according to claim 1, wherein the valve chamber heat transfer element is arranged to extend from the valve chamber to the precursor source chamber and the precursor source arrangement comprises a first precursor supply conduit extending from the precursor source chamber to the valve chamber above the valve chamber heat transfer element.

15. The precursor source arrangement according to claim 1, wherein the one or more valves are attached to the valve chamber heat transfer element inside the valve chamber.

16. The precursor source arrangement according to claim 1, wherein the valve chamber comprises a precursor supply connection arranged to a valve chamber wall, and a second precursor supply conduit extending from the valve to the precursor supply connection, the precursor supply connection being arranged in vertical direction above the valve in the valve chamber.

17. The precursor source arrangement according to claim 1, wherein the precursor source arrangement comprises a precursor source casing surrounding the precursor source chamber and the valve chamber, the precursor source chamber and the valve chamber being arranged inside the precursor source casing, and the precursor source casing comprising a ventilation inlet and a ventilation outlet for ventilating the inside of the precursor source casing.

18. The precursor source arrangement according to claim 17, wherein:
- the ventilation outlet is provided in a vertical direction above the ventilation inlet inside the precursor source casing; or
- the ventilation inlet is arranged in a vertical direction below the precursor source chamber, and the ventilation outlet is provided in the vertical direction above the ventilation inlet inside the precursor source casing; or
- the ventilation outlet is provided in the vertical direction above valve chamber and in the vertical direction above the ventilation inlet (inside the precursor source casing; or
- the ventilation inlet is arranged in the vertical direction below the precursor source chamber, and the ventilation outlet is provided in the vertical direction above the valve chamber, and the ventilation outlet is provided in the vertical direction above the ventilation inlet inside the precursor source casing.

19. The precursor source arrangement according to claim 1, wherein the precursor source arrangement comprises a first precursor source chamber connected to the valve chamber and a second precursor source chamber connected to the valve chamber, the first and second precursor source chamber being at a distance from each other such that a flow gap is provided between the first and second precursor source chamber for ventilation gas flow.

20. An atomic layer deposition apparatus for processing a substrate according to principles of atomic layer deposition method, the apparatus comprising:
- a vacuum chamber;
- a reaction chamber inside the vacuum chamber;
- a process heater arranged inside the vacuum chamber for heating the reaction chamber inside the vacuum chamber;
- a precursor source arrangement;
- a lead-through connection provided to and extending from the vacuum chamber between the vacuum chamber and the precursor source arrangement; and
- a second precursor supply conduit extending from the precursor source arrangement inside the vacuum chamber via the lead-through connection, wherein:

the precursor source arrangement is a precursor source arrangement according to claim 1;

the precursor source arrangement comprises a precursor supply connection;

the second precursor supply conduit is connected to the precursor supply connection; and the precursor supply connection is connected to the lead-through connection.

21. The precursor source arrangement according to claim 1, further including a heat transfer block disposed within the precursor source chamber, in contact with the valve chamber heater transfer element, and spaced from the valve chamber.

22. The precursor source arrangement according to claim 1, wherein at least a portion of the valve chamber heat transfer element is positioned outside of the precursor source chamber.

23. The precursor source arrangement according to claim 1, wherein at least a portion of the valve chamber is spaced from precursor source chamber.

* * * * *